United States Patent
Yu et al.

(10) Patent No.: US 8,717,106 B2
(45) Date of Patent: May 6, 2014

(54) AMPLIFIER CIRCUIT AND METHOD FOR IMPROVING THE DYNAMIC RANGE THEREOF

(75) Inventors: Chi-Yao Yu, Zhubei (TW); Siu-Chuang Ivan Lu, San Jose, CA (US); George Chien, Saratoga, CA (US)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/612,805

(22) Filed: Sep. 12, 2012

(65) Prior Publication Data

US 2013/0187718 A1 Jul. 25, 2013

Related U.S. Application Data

(60) Provisional application No. 61/588,328, filed on Jan. 19, 2012.

(51) Int. Cl.
*H03F 3/193* (2006.01)
(52) U.S. Cl.
USPC .......................................... 330/310; 330/266

(58) Field of Classification Search
USPC ................... 330/262–276, 310–311
See application file for complete search history.

(56) References Cited

U.S. PATENT DOCUMENTS

| 8,497,736 B1 * | 7/2013 | Leipold et al. ................. 330/267 |
| 2013/0113568 A1 * | 5/2013 | Brunn et al. ................... 330/269 |

\* cited by examiner

*Primary Examiner* — Hieu Nguyen
(74) *Attorney, Agent, or Firm* — McClure, Qualey & Rodack, LLP

(57) ABSTRACT

The invention provides an amplifier circuit. In one embodiment, the amplifier circuit includes a first class-AB amplifier and a second class-AB amplifier. The first class-AB amplifier amplifies an input signal to generate the first output signal. The second class-AB amplifier amplifies the first output signal to generate a final output signal on an output node. When the power of the input signal is greater than a threshold level, the second class-AB amplifier is in a turned-off state during a turned-on duration period of the first class-AB amplifier, and the first class-AB amplifier is in a turned-off state during a turned-on duration period of the second-class AB amplifier.

16 Claims, 13 Drawing Sheets

AMPLIFIER CIRCUIT AND METHOD FOR IMPROVING THE DYNAMIC RANGE THEREOF

CROSS REFERENCE TO RELATED APPLICATIONS

This application claims the benefit of U.S. Provisional Application No. 61/588,328, filed on Jan. 19, 2012, the entirety of which is incorporated by reference herein.

BACKGROUND OF THE INVENTION

1. Field of the Invention

The invention relates to amplifier circuits, and more particularly to dynamic range improvement for amplifier circuits.

2. Description of the Related Art

A radio frequency receiver system receives and processes a radio frequency signal. An antenna receives the radio frequency signal for the radio frequency receiver system. The received signal generated by the antenna comprises a wanted signal component and a blocker signal component. The wanted signal component is generated by a target transmitting station, and the blocker signal component, which is also referred to as a jammer signal component, is generated by jamming stations. Ordinarily, the wanted signal component has a small amplitude (e.g. −99 dBm) in comparison with the amplitude of the blocker signal component (e.g. 0 dBm).

The blocker signal received by the antenna induces difficulties in the processing of the wanted signal. There are three main problems when a large block beside the wanted signal is received. The first one is wanted signal gain compression. When the amplitude of the blocker signal is too large such that the voltage headroom of an amplifier is not enough to process the blocker signal, the wanted signal gain is compressed; so the signal to noise ratio (SNR) is also degraded. The second problem to degrade the SNR is the reciprocal mixing noise. The received blocker signal is always mixed with the phase noise of the local oscillation (LO) signal and it results in extra reciprocal in-band noise. The third one is in-band blocker induced noise. Due to finite linearity of the receiving chain, the device noise is also mixed with the blocker signal and some of them fall into the signal band and degrades SNR.

A designer of the radio frequency receiver system therefore must increase the dynamic range of the radio frequency receiver system to improve the performance thereof. The dynamic range of a system indicates a ratio of the largest tolerable blocker (e.g. 0 dBm) to a given wanted signal (e.g. −99 dBm). To increase the dynamic range of a radio frequency receiver system, a filter for filtering out the blocker signal component from the received signal is added to the radio frequency receiver system. Referring to FIG. 1, a block diagram of a portion of a radio frequency receiver system is shown. In one embodiment, the radio frequency receiver 100 comprises an antenna 102, a SAW filter 104, an LNA 106, a mixer 108, a baseband amplifier 110, and an ADC. The antenna 102 receives a radio frequency signal to generate an input signal. The SAW filter 104 filters out the blocker signal component from the input signal. Therefore, the receiving chain after the SAW filter 104 does not affect by the blocker signal and the dynamic range is improved. However, the SAW filter 104 degrades the wanted signal level; so the receiving sensitivity is also degraded. Moreover, it increases the bill of material (BOM) cost.

If the SAW filter 104 is removed in the receiving system, the blocker signal is directly received by LNA 106. Referring to FIG. 2A, a circuit diagram of a conventional low noise amplifier 200A to handle such blocker signal is shown. In FIG. 2A, transistors M1 and M2 are biased in the weakly inversion region. Therefore, when a large blocker signal is received, the low noise amplifier 200A functions like a class-AB amplifier. Such class-AB LNA has self-biasing characteristic as a general class-AB amplifier. The current consumption of the class-AB LNA is automatically adjusted according the blocker level. When the received blocker signal is larger its current consumption also becomes larger and this results in larger gain, i.e. gain expansion. Such gain expansion can compensate the gain compression from other nodes in the amplifier, e.g. the output nodes of the amplifier. Therefore, the dynamic range can be enhanced without boosting its average current.

Although the dynamic range and current consumption problem of the input stage (i.e., transistors M1 and M2) are solved, a load inductor $L_{load}$ is required to increase its output voltage headroom to prevent the dynamic range is limited by it. However, the load inductors $L_{load}$ occupy a large chip area and increases a hardware cost. When the load inductors $L_{load}$ are replaced with PMOS transistors (as shown in FIG. 2B (i.e., the "conventional class-AB amplifier" in the detailed description)) to reduce a chip area, the voltage swing level of the output signal of the low noise amplifier 200B is reduced, and the low noise amplifier 200B has difficulties to process an input signal comprising a blocker signal component with high amplitude. The situation is worse in the deep submicron technology since the supply voltage is lower. Thus, an amplifier circuit is required in a radio frequency receiver system for increasing the dynamic range of the radio frequency receiver system.

BRIEF SUMMARY OF THE INVENTION

The invention provides an amplifier circuit. In one embodiment, the amplifier circuit comprises a first class AB amplifier and a second class AB amplifier. The first class AB amplifier receives an input signal, and amplifies the input signal to generate a first output signal. The second class AB amplifier receives the first output signal, and amplifies the first output signal to generate a final output signal on an output node. When the power of the input signal is greater than a threshold level, the second class AB amplifier is in a turned-off state during a turned-on duration period of the first class AB amplifier, and the first class AB amplifier is in a turned-off state during a turned-on duration period of the second class AB amplifier.

The invention further comprises a method for improving the dynamic range of an amplifier circuit. In one embodiment, the amplifier circuit comprises a first class AB amplifier and a second class AB amplifier. First, an input signal is amplified by the first class AB amplifier to generate a first output signal. The first output signal is also amplified by the second class AB amplifier to generate a final output signal on an output node. Whether the power of the input signal is greater than a threshold level is then determined. When the power of the input signal is greater than the threshold level, the second class AB amplifier is kept in a turned-off state during a turned-on duration period of the first class AB amplifier, and the first class AB amplifier is kept in a turned-off state during a turned-on duration period of the second class AB amplifier.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
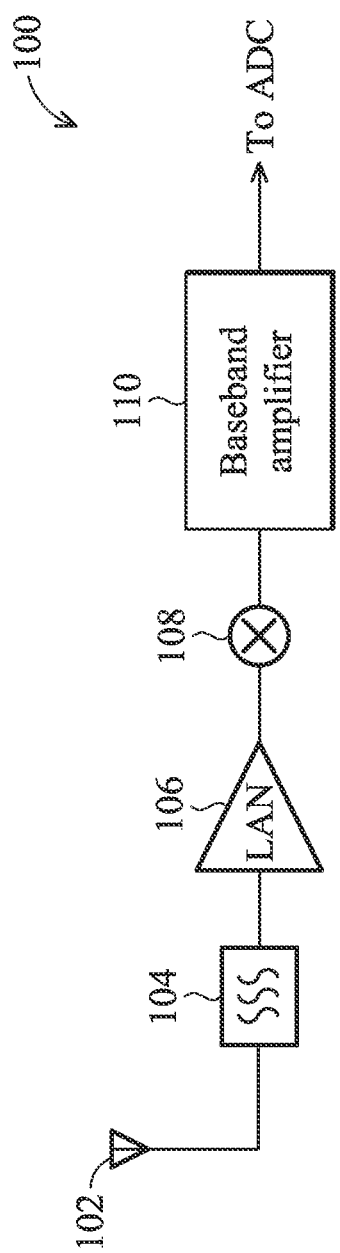
FIG. 1 is a block diagram of a portion of a radio frequency receiver system.
Figure 2A:
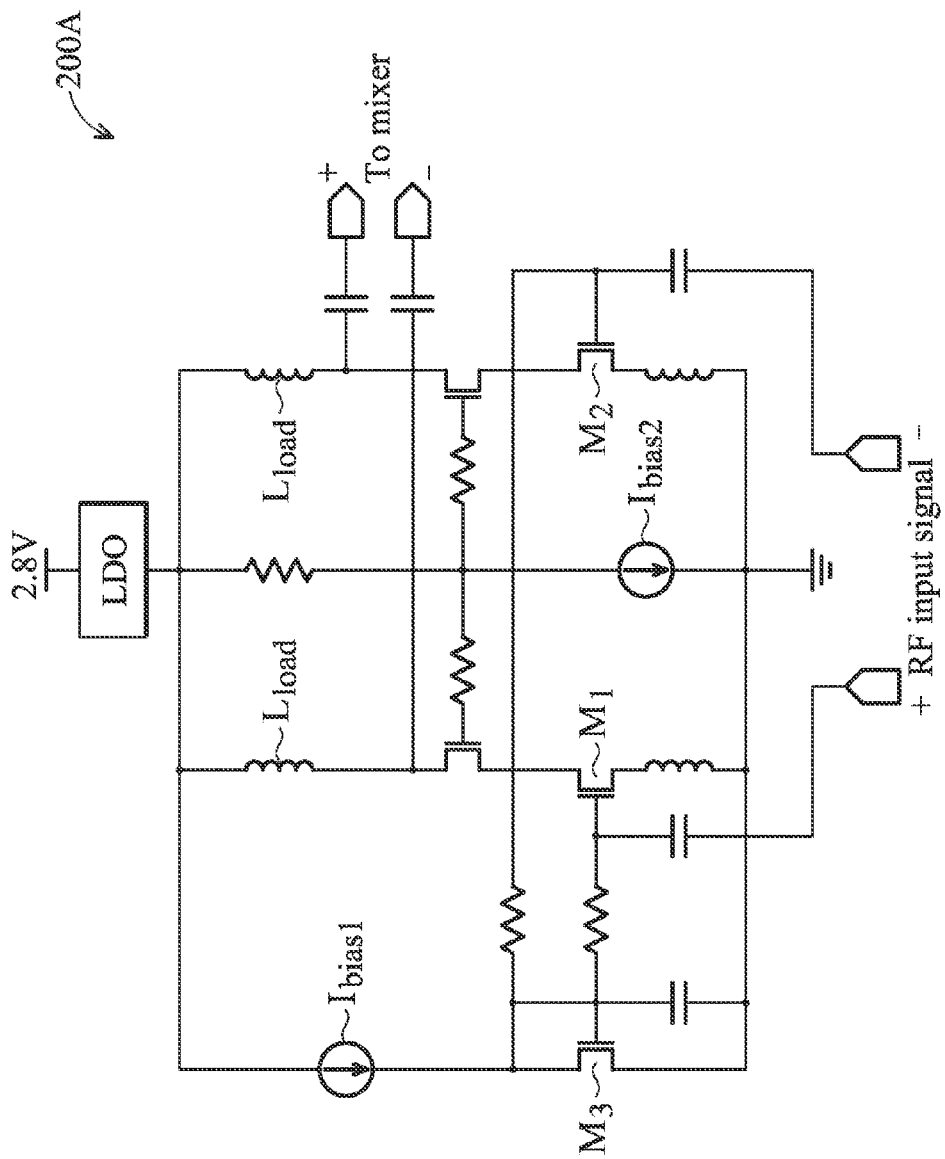
FIG. 2A is a circuit diagram of a conventional low noise amplifier.
Figure 2B:
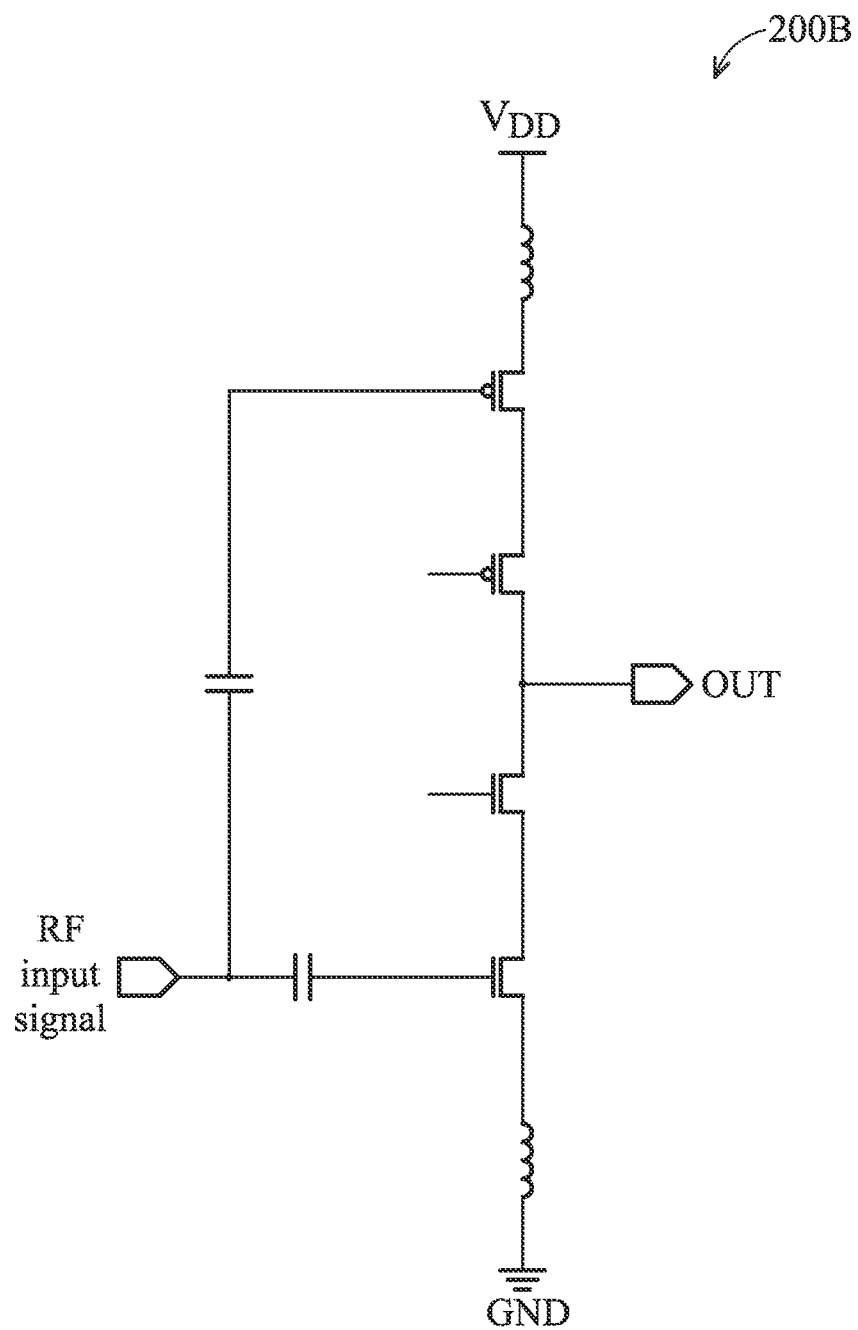
FIG. 2B is a circuit diagram of a conventional class-AB amplifier.
Figure 3:
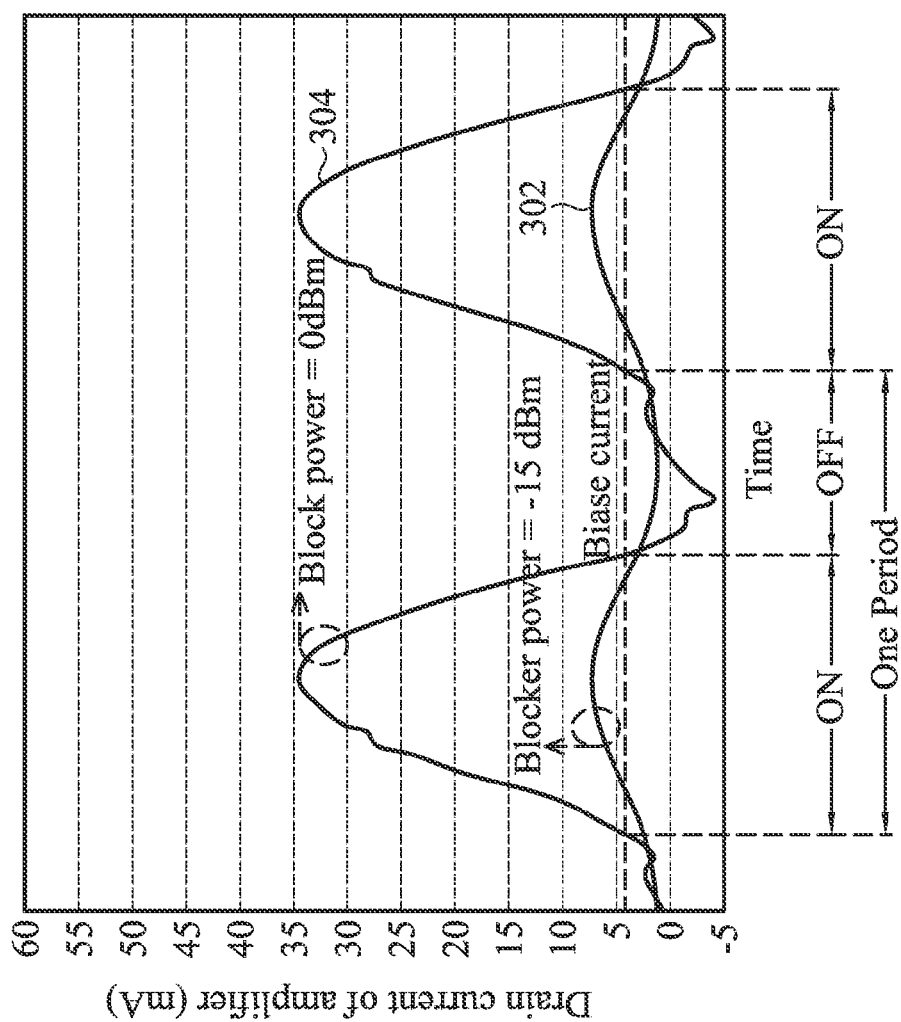
FIG. 3 is a schematic diagram of a current level flowing through a class AB amplifier.

Referring to FIG. 3, a schematic diagram of a current level flowing through a class AB amplifier is shown. The average current of a class AB amplifier is changed with the amplitude of an input signal. When the input signal has a small amplitude, the class AB amplifier operates as a class A amplifier and amplifies the input signal with a constant gain to obtain an output signal and its average current is equal to the bias current. For example, the class AB amplifier amplifies a blocker signal with a power level of −15 dBm to obtain the output wave 302 shown in FIG. 3. When the input signal has a large amplitude, the class AB amplifier is turned on and amplifies the input signal during a specific phase range of the wave cycle of the input signal, and turned off during the remainder of the phase range of the wave cycle of the input signal. Moreover, its average current is higher than the bias current in this situation. For example, when the power level of a blocker signal is 0 dBm, the class AB amplifier amplifies the blocker signal with a boosting current consumption during the turning-on duration period of the class AB amplifier, and does not amplify the blocker signal during the turning-off duration period of the class AB amplifier, as the wave 304 shows in FIG. 3. A class AB amplifier therefore alternates between a turning-on state and a turning-off state according to the phase of the wave cycle of the input signal.

Figure 4A:
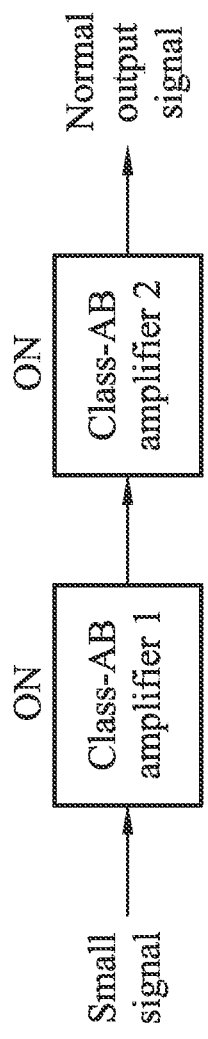
FIG. 4A is a schematic diagram of two class-AB amplifiers receiving an input signal with a small amplitude according to the invention.
Figure 4B:
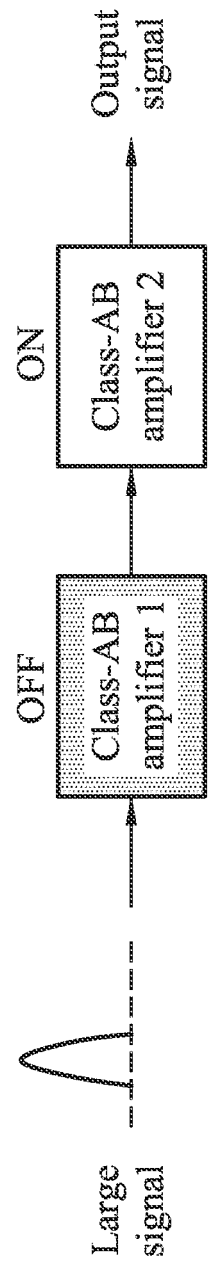
FIGS. 4B and 4C are schematic diagrams of two class-AB amplifiers receiving a large blocker signal according to the invention.
Figure 4C:
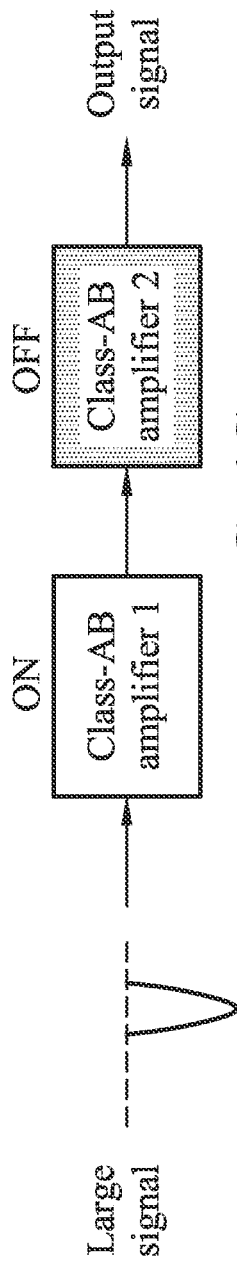

In one embodiment, an amplifier circuit according to the invention comprises two class AB amplifiers coupled to a single signal path, and the two class-AB amplifiers are cascaded. The amplifier circuit may be a baseband amplifier circuit for amplifying a baseband signal or a radio frequency circuit for amplifying a radio frequency signal. In one embodiment, the amplifier circuit is used in a SAW-less receiver system. Referring to FIG. 4A, a schematic diagram of two class-AB amplifiers receiving an input signal with small amplitude according to the invention is shown. Because the two class AB amplifiers both operate as class A amplifiers, the first class AB amplifier and the second class AB amplifier are always in a turned-on state and both amplify the input signal; therefore, the input signal can successfully amplified to the output signal. Referring to FIGS. 4B and 4C, schematic diagrams of two class-AB amplifiers receiving a large blocker signal according to the invention is shown. When a large blocker signal is received by the receiver system, the class AB amplifiers alternate between a turned-on state and a turned-off state according to the phase of the large blocker signal. During a positive wave cycle of the large blocker signal, the second class AB amplifier is in a turned-on state, but the first class AB amplifier is in a turned-off state. Therefore, the input signal is blocked by the first class AB amplifier and there is no output signal. During a negative wave cycle of the large blocker signal, the first class AB amplifier is in a turned-on state, but the second class AB amplifier is in a turned-off state. The input signal is blocked by the second class AB amplifier and there is no output signal. In summary, the path is turned on and amplifies the input signal to output signal when input signal is small but is turned off when the input signal is large. If such path is inserted into an amplifier, it can provide portion of gain when the input signal is small but is turned off when the input signal is large. Therefore, in the scenario there is no blocker signal and only wanted signal, i.e. small signal case, the path provides a portion of gain. However, in the scenario of receiving a large blocker (e.g. 0 dBm), i.e. large signal case, the path is turned off; or equivalently, the gain of the amplifier is reduced automatically. So, the amplifier output headroom requirement is relaxed. Moreover, because the output blocker is smaller due to smaller gain, both reciprocal mixing noise and blocker induced noise are smaller such that the amplifier can handle larger blocker signal and its dynamic range can be improved significantly.

Figure 5:
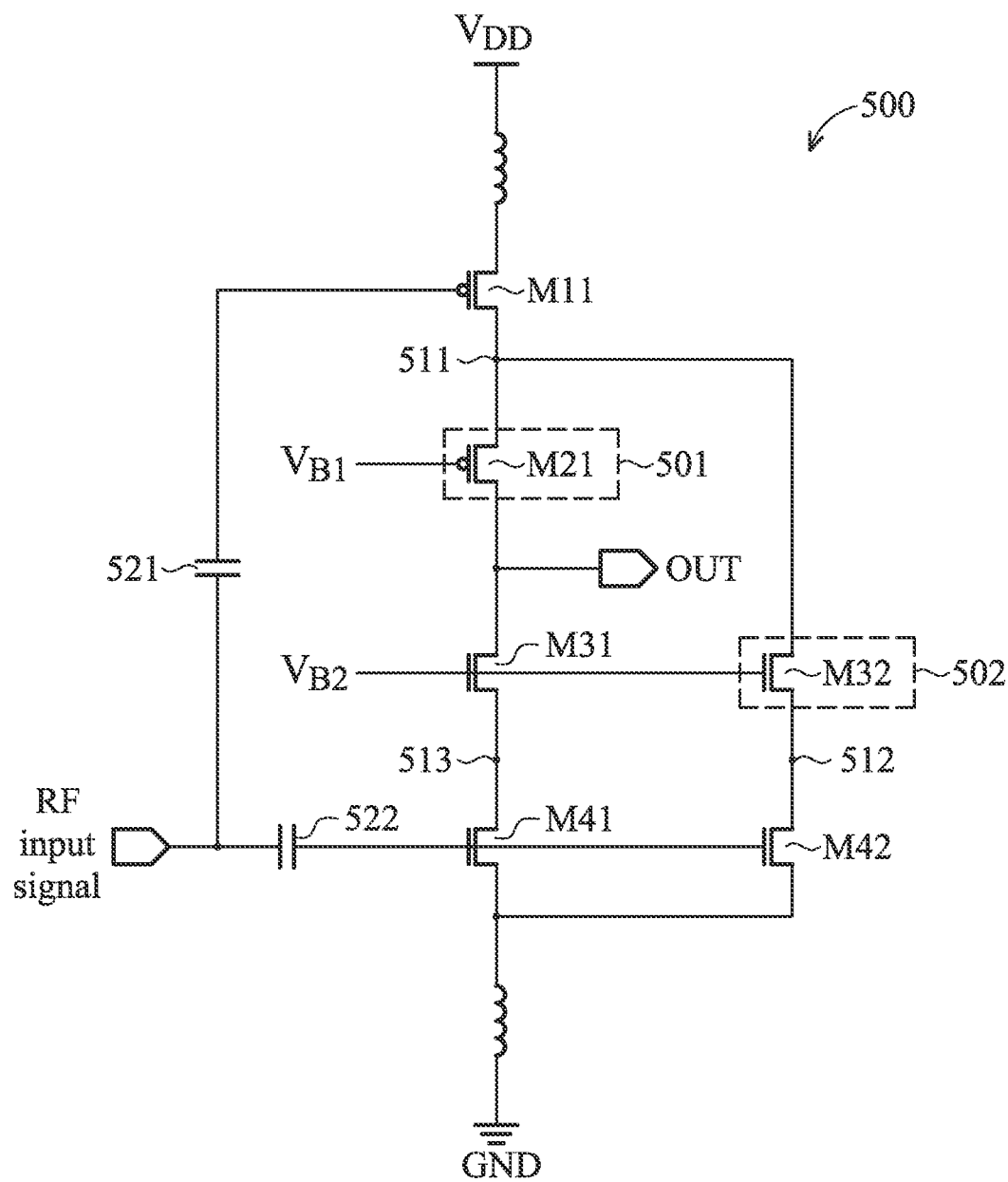
FIG. 5 is a schematic diagram of an embodiment of an amplifier circuit according to the invention.

Referring to FIG. 5, a schematic diagram of an embodiment of an amplifier circuit 500 according to the invention is shown. The amplifier circuit comprises two PMOS transistors M11 and M21 and four NMOS transistors M31, M41, M32, and M42. The PMOS transistor M11 is coupled between a degeneration inductor (not necessary) and a node 511, and has a gate coupled to an input signal via a capacitor 521. The PMOS transistor M21 is coupled between the node 511 and an output node OUT, and has a gate coupled to a bias voltage $V_{B1}$. The NMOS transistor M31 is coupled between the output node OUT and a node 513, and has a gate coupled to a bias voltage $V_{B2}$. The NMOS transistor M41 is coupled between the node 513 and a degeneration inductor (not necessary), and has a gate coupled to the input signal via a capacitor 522. The NMOS transistor M32 is coupled between the node 511 and a node 512, and has a gate coupled to the bias voltage $V_{B2}$. The NMOS transistor M42 is coupled between the node 512 and a degeneration inductor (not necessary), and has a gate coupled to the input signal via the capacitor 522. The amplifier circuit 500 comprises a first class AB amplifier 502 and a second class AB amplifier 501. In one embodiment, the second class AB amplifier 501 comprises the PMOS transistor M21, and the first class AB amplifier 502 comprises the NMOS transistor M32. It should be noted that the degeneration inductors coupled between the voltage source $V_{DD}$ and the node 511 and coupled between the NMOS transistor M41 and ground GND are arranged for input matching of a LNA. In one embodiment, the degeneration inductors can be removed from the amplifier circuit 500. Namely, the amplifier circuit 500 can be normally operated, whether the degeneration inductors are used or not.

Figure 6:
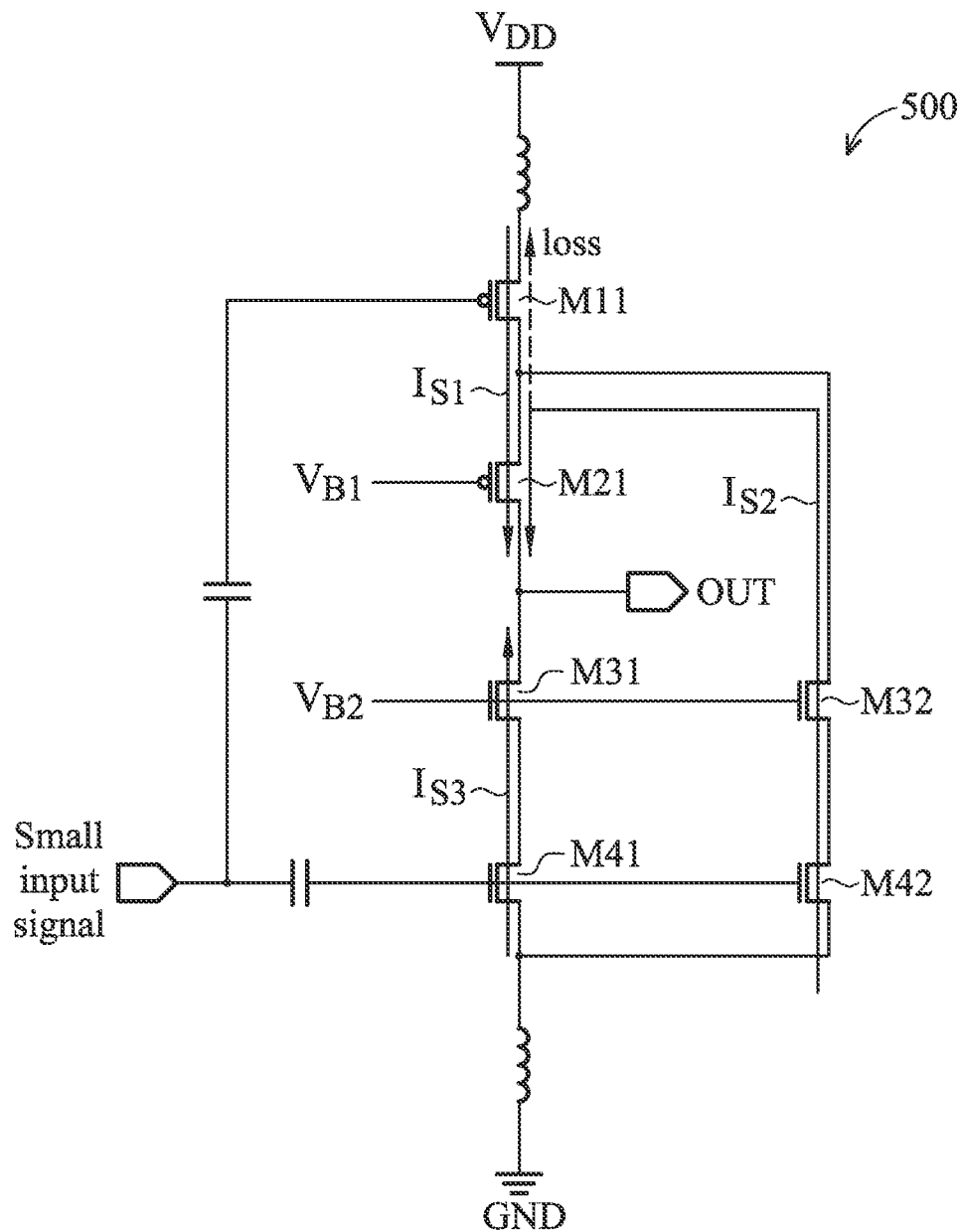
FIG. 6 is a schematic diagram of current flows in the amplifier circuit shown in FIG. 5 when the amplifier circuit receives a small input signal.

Referring to FIG. 6, a schematic diagram of current flows in the amplifier circuit 500 when the amplifier circuit 500 receives a small input signal is shown. In one embodiment, the small input signal comprises no blocker signal component. Because the amplitude of the input signal is low, all of the transistors M11, M21, M31, M41, M32, and M42 are turned on. When the voltage level of the small input signal is lowered, a source-to-gate voltage $V_{SG}$ of the PMOS transistor M11 is increased, and the level of the current $I_{S1}$ flowing through the PMOS transistor M11 is therefore increased. Similarly, when the voltage level of the small input signal is lowered, a gate-to-source voltage $V_{GS}$ of the NMOS transistors M41 and M42 is decreased, and the level of the currents $I_{S2}$ and $I_{S3}$ inversely flowing through the NMOS transistors M42 and M41 is therefore increased. A major portion of the current $I_{S2}$ flows through the PMOS transistor M21, and a tiny portion of the current $I_{S2}$ flowing through the PMOS transistor M11 becomes a leak portion. The gain of the amplifier circuit is therefore slightly decreased in comparison with a conventional amplifier circuit. Namely, the amplifier circuit 500, the first class AB amplifier 502 receives the input signal, and amplifies the input signal to generate the first output signal (i.e., the major portion of the current $I_{S2}$), and the second class AB amplifier 501 receives the first output signal and amplifies the first output signal to generate the final output signal on the output node OUT.

Figure 7A:
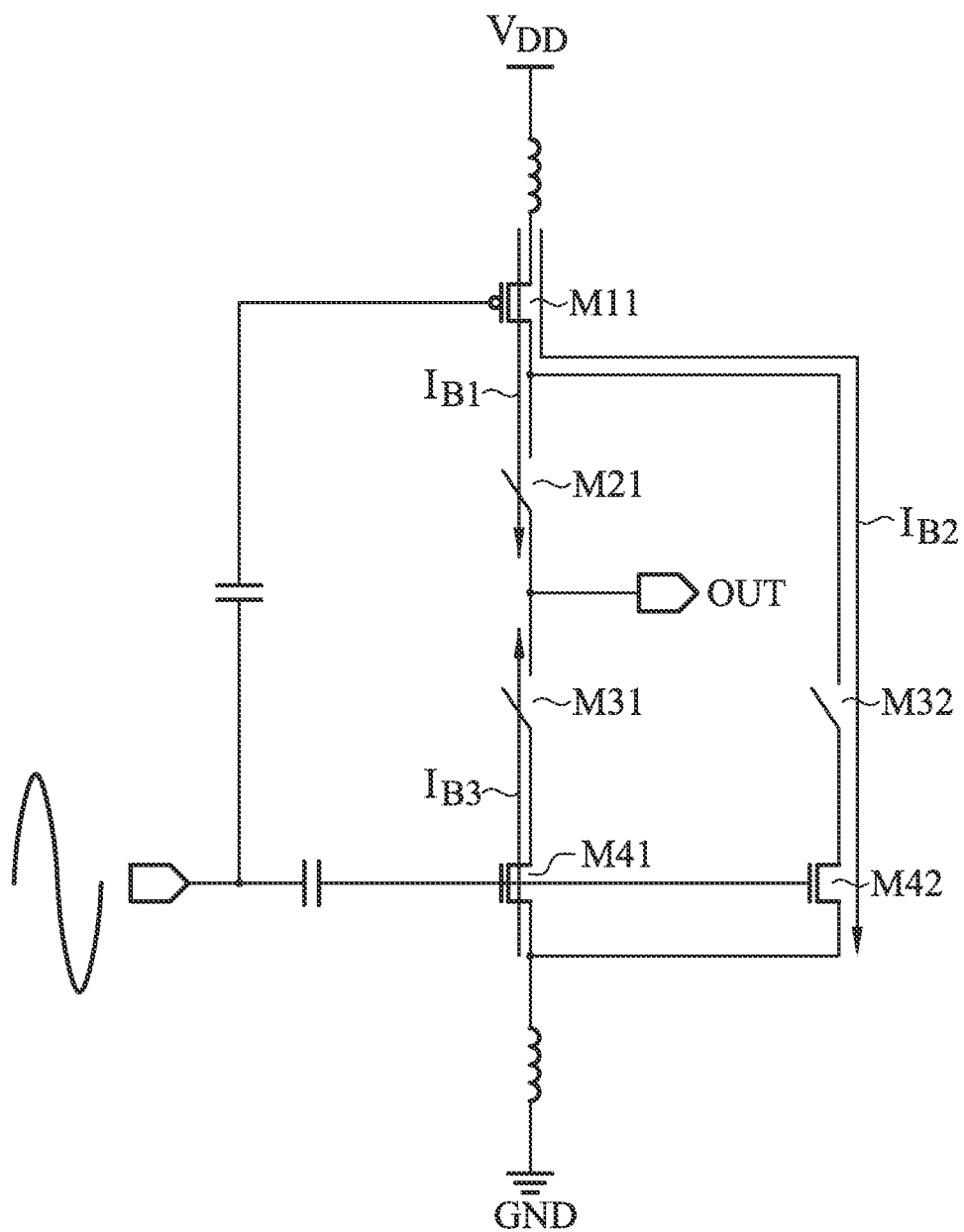
FIG. 7A is a schematic diagram of operations of the amplifier circuit shown in FIG. 5 when the amplifier circuit receives a large blocker signal.

Referring to FIG. 7A, a schematic diagram of operations of the amplifier circuit 500 when the amplifier circuit 500 receives a large blocker signal is shown. When the input signal of the amplifier circuit 500 comprises a blocker signal with a high amplitude greater than a threshold level, the PMOS transistor M21 and the NMOS transistors M31 and M32 are modeled with switches. When the voltage level of the input blocker signal is increased beyond the threshold, the source-to-gate voltage $V_{SG}$ of the PMOS transistor M21 is decreased to turn off the PMOS transistor M21, and the gate-to-source voltages $V_{GS}$ of the NMOS transistors M32 and M31 are increased to turn on the NMOS transistors M32 and M31. Thus, during a positive wave cycle of the input blocker signal, the PMOS transistor M21 is turned off, the NMOS transistors M31 and M32 are turned on, the first class AB amplifier 502 is therefore in a turned-on state, and the second class AB amplifier 501 is therefore in a turned-off state. When the voltage level of the input blocker signal is reduced below the threshold, the source-to-gate voltage $V_{SG}$ of the PMOS transistor M21 is increased to turn on the PMOS transistor M21, and the gate-to-source voltages $V_{GS}$ of the NMOS transistors M32 and M31 are decreased to turn off the NMOS transistors M32 and M31. Thus, during a negative wave cycle of the input blocker signal, the PMOS transistor M21 is turned on, the NMOS transistors M31 and M32 are turned off, the first class AB amplifier 502 is therefore in a turned-off state, and the second class AB amplifier 501 is therefore in a turned-on state. Because either of the first class AB amplifier 502 and the second class AB amplifier 501 is in a turned-off state, the amplified current from the NMOS transistor M42 cannot go to the output node. Therefore, the blocker gain when a large blocker signal is received is smaller than that when the blocker signal is small.

Figure 7B:
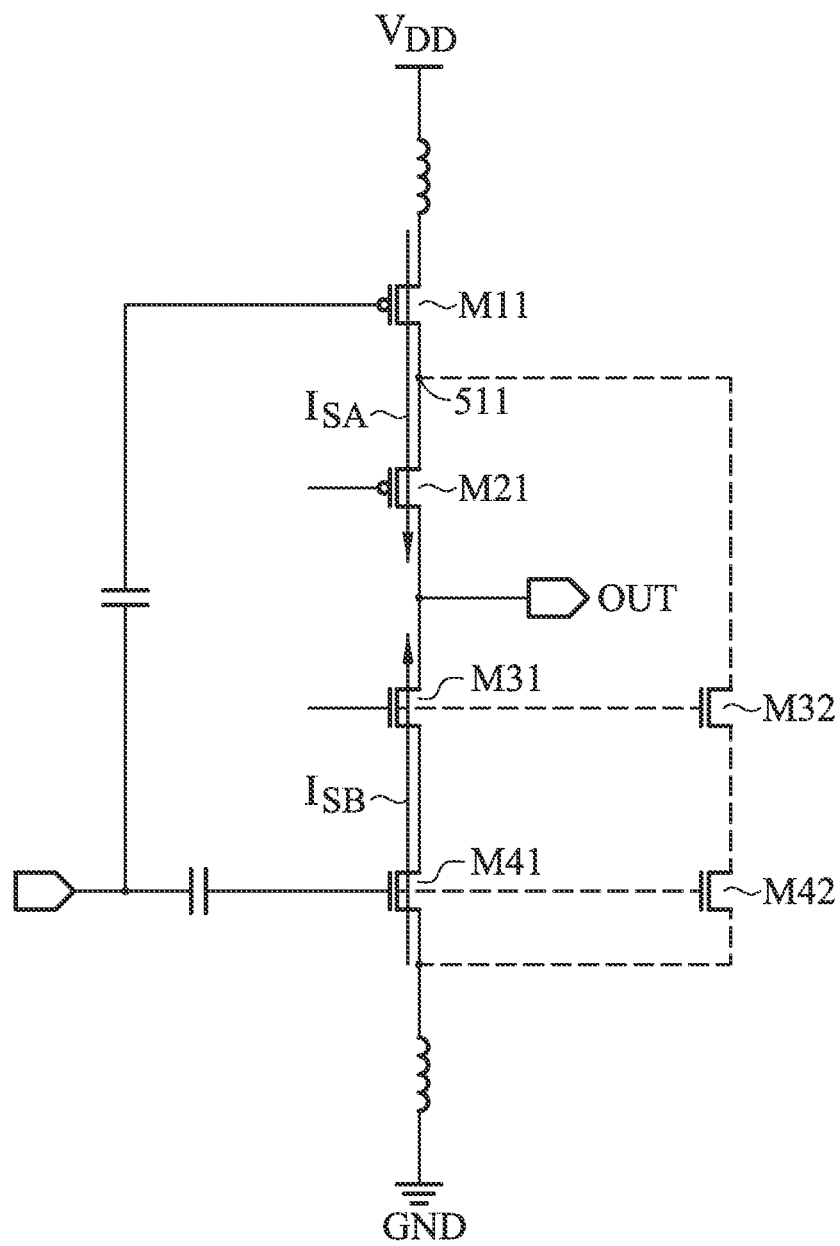
FIG. 7B is a schematic diagram of a small signal path of the amplifier circuit shown in FIG. 5 when the amplifier circuit receives a large blocker signal.

Referring to FIG. 7B, a schematic diagram of a small signal path (i.e. wanted signal path) of the amplifier circuit 500 when the amplifier circuit 500 receives a large blocker signal is shown. Because the NMOS transistor M32 is turned off when the PMOS transistor M21 is turned on, and the PMOS transistor M21 is turned off when the NMOS transistor M32 is turned on, the small signal current generated by the NMOS transistor M42 cannot go to the output node. Therefore, the small signal path from the NMOS transistors M32 and M42 are equivalently turned off. The output small signal is only the combination of $I_{SA}$ from the PMOS transistor M11 and $I_{SB}$ from the NMOS transistor M41. This implies that the small signal gain also decreases when a large blocker is received. However, referring to FIG. 7A, since the blocker gain is smaller when blocker signal is large, the large blocker swing at the output node is smaller in comparison to a conventional class-AB amplifier. Therefore, the gain compression from the output node of the amplifier circuit 500 is also smaller than the conventional class-AB amplifier. For those toughest cases, e.g. blocker power >0 dBm, the small signal gain of the circuit in FIG. 7B is instead larger than the conventional class-AB amplifier due to smaller gain compression.

Figure 8A:
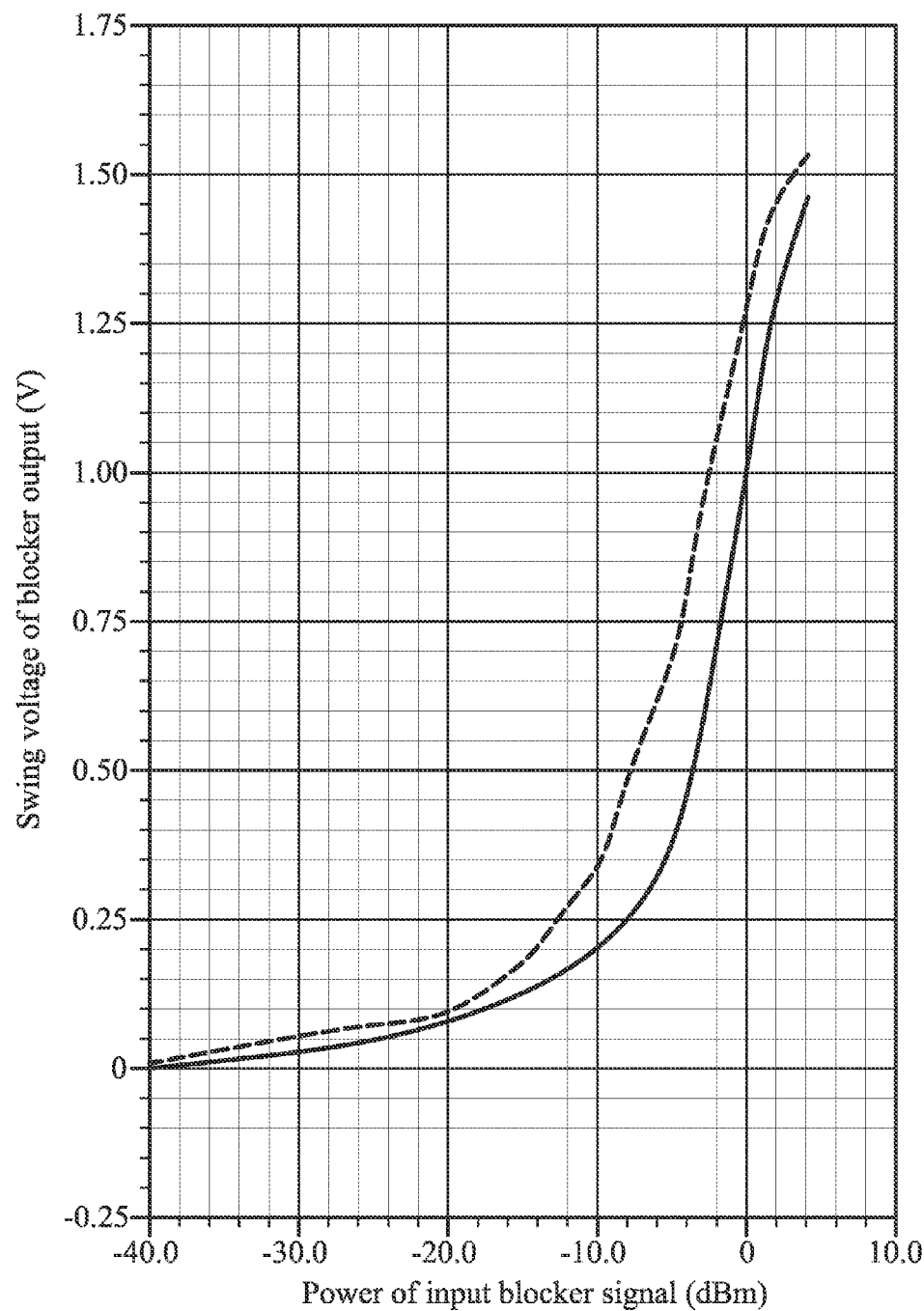
FIG. 8A is a schematic diagram of the voltage swing of an amplified blocker signal output by the amplifier circuit shown in FIG. 5.

Referring to FIG. 8A, a schematic diagram of the voltage swing of an amplified blocker signal output by the amplifier circuit 500 is shown. A solid line indicates the output blocker voltage swing of the amplifier circuit 500 when the power of the input blocker signal changes from −40 dBm to 10 dBm. A dotted line indicates the blocker output voltage swing of a conventional class-AB amplifier for comparison with the amplifier circuit 500 of the invention. When the power of the input blocker signal is increased, the output blocker swing of the amplifier circuit 500 also increases. The output blocker swing of the amplifier circuit 500, however, is less than that of the conventional amplifier. Because the input blocker signal results in reciprocal mixing noise and blocker induced noise, when the swing for amplifying the blocker signal is reduced, the noise level in the output signal is also reduced. Moreover, when the blocker signal is large enough, e.g. >0 dBm, the gain compression becomes the dominate term to affect the small signal gain. In the invention, the gain compression is also much smaller due to smaller output blocker swing; so the small signal gain is larger in this region in comparison to conventional class-AB LNA. Therefore, the dynamic range of the amplifier circuit 500 of the invention is improved in comparison with that of the conventional class-AB amplifier. The performance of the amplifier circuit 500 is therefore better than that of the conventional class-AB amplifier.

Figure 8B:
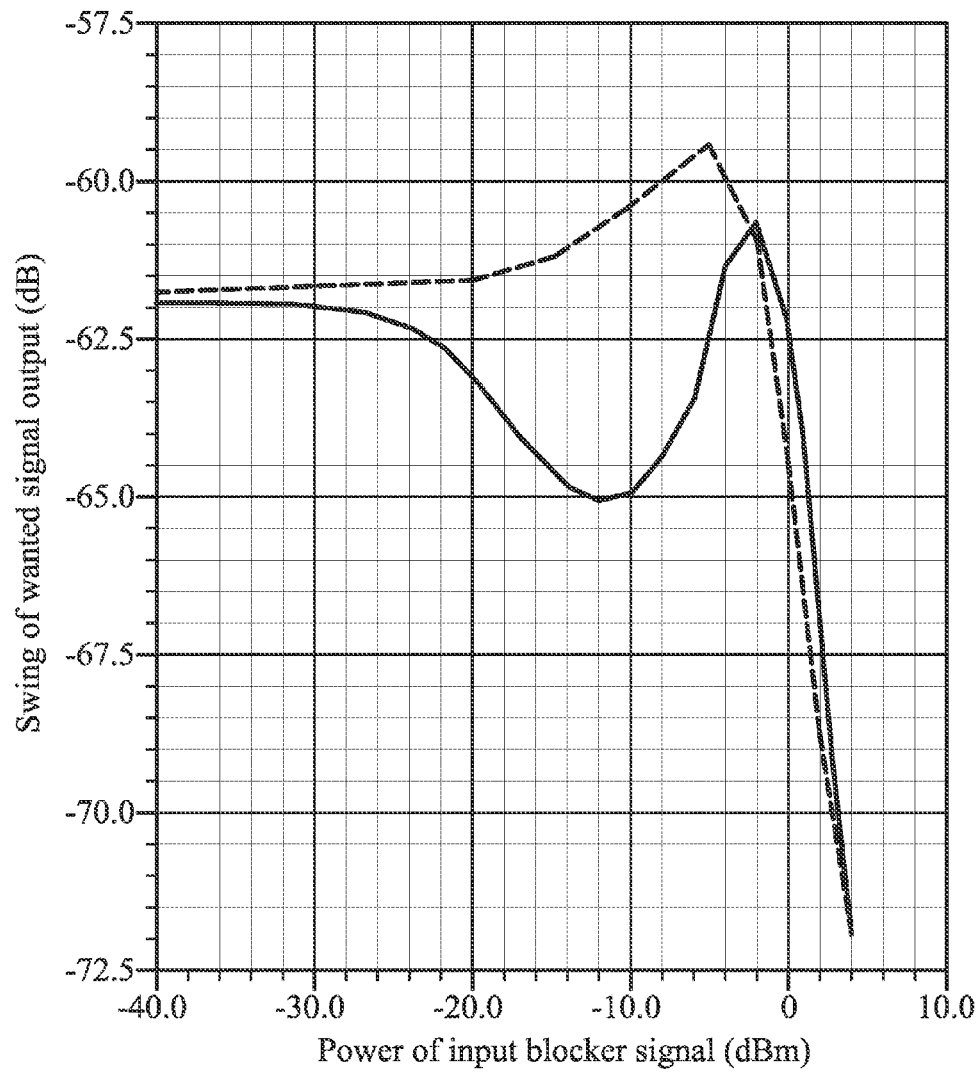
FIG. 8B is a schematic diagram of the voltage swing of an amplified small wanted signal output by the amplifier circuit shown in FIG. 5.

Referring to FIG. 8B, a schematic diagram of the voltage swing of an amplified small wanted signal output (when the input signal is −99 dBm) by the amplifier circuit 500 is shown. A solid line indicates the gain of the amplifier circuit 500 for amplifying the small wanted signal when the power of an input blocker signal changes from −40 dBm to 10 dBm. A dotted line indicates the gain of a conventional class-AB amplifier for comparison with the gain of the amplifier circuit 500 of the invention. When the power of the input blocker signal is equal to −12 dBm, the small signal path which consists of NMOS transistors M32 and M42 of the amplifier circuit 500 is turned off, and the gain of the amplifier circuit 500 for amplifying the small wanted signal is reduced to −65 dBm. When the power of the input blocker signal is greater than −2 dBm, the gain of the amplifier circuit 500 for amplifying the small wanted signal is greater than that of the conventional class-AB amplifier. The performance of the amplifier circuit 500 is therefore better than that of the conventional amplifier.

Figure 9A:
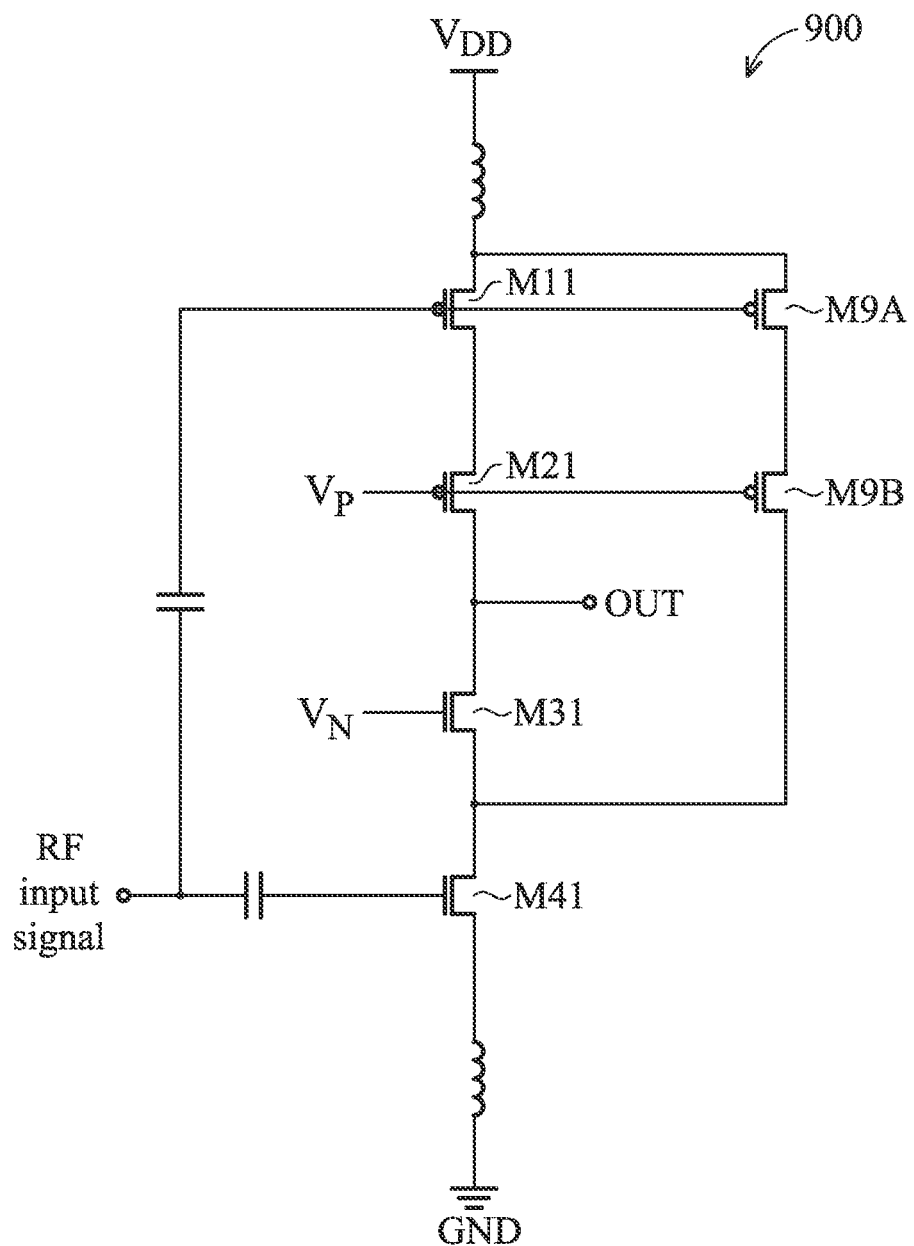
FIG. 9A is a schematic diagram of a second embodiment of an amplifier circuit according to the invention.

Referring to FIG. 9A, a schematic diagram of a second embodiment of an amplifier circuit 900 according to the invention is shown. The amplifier circuit 900 has a similar circuit structure as that of the amplifier circuit 500 shown in FIG. 5. The amplifier circuit 900 comprises PMOS transistors M11, M21, M9A, and M9B and NMOS transistors M31 and M41. The PMOS transistors M11 and M21 and the NMOS transistors M31 and M41 are cascaded between the voltage source $V_{DD}$ and ground GND. In comparison with the amplifier circuit 500 shown in FIG. 5, the NMOS transistors M32 and M42 are removed from the amplifier circuit 900 and two extra PMOS transistors M9A and M9B are added to the amplifier circuit 900. The PMOS transistors M9A and M9B are cascaded between the source of the PMOS transistor M11 and the source of the NMOS transistor M31. The gate of the PMOS transistor M9A is coupled to the gate of the PMOS transistor M11, and the gate of the PMOS transistor M9B is coupled to the gate of the PMOS transistor M21. The amplifier circuit 900 therefore has similar function and similar operations as those of the amplifier circuit 500 shown in FIG. 5.

Figure 9B:
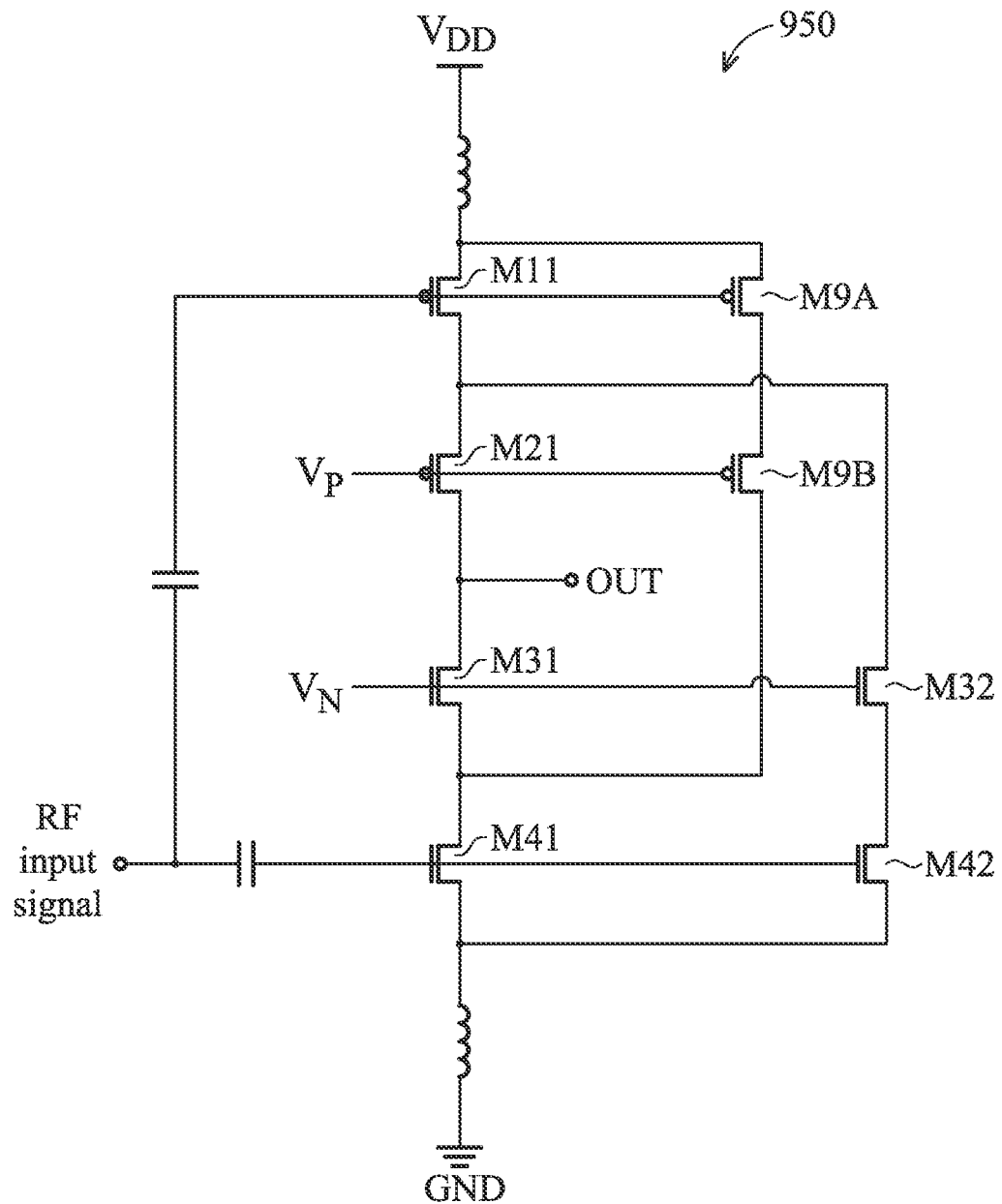
FIG. 9B is a schematic diagram of a third embodiment of an amplifier circuit according to the invention.

Referring to FIG. 9B, a schematic diagram of a third embodiment of an amplifier circuit 950 according to the invention is shown. The amplifier circuit 950 also has a similar circuit structure as that of the amplifier circuit 500 shown in FIG. 5. The amplifier circuit 950 comprises PMOS transistors M11, M21, M9A, and M9B and NMOS transistors M31, M41, M32, and M42. The PMOS transistors M11 and M21 and the NMOS transistors M31 and M41 are cascaded between the voltage source $V_{DD}$ and ground GND. In comparison with the amplifier circuit 500 shown in FIG. 5, two extra PMOS transistors M9A and M9B are added to the amplifier circuit 950. The PMOS transistors M9A and M9B are cascaded between the source of the PMOS transistor M11 and the source of the NMOS transistor M31. The gate of the PMOS transistor M9A is coupled to the gate of the PMOS transistor M11, and the gate of the PMOS transistor M9B is coupled to the gate of the PMOS transistor M21. The NMOS transistors M32 and M42 are cascaded between the source of the PMOS transistor M21 and the source of the NMOS transistor M42. The gate of the NMOS transistor M32 is coupled to the gate of the NMOS transistor M31, and the gate of the NMOS transistor M42 is coupled to the gate of the NMOS transistor M41. The amplifier circuit 950 therefore has similar function and similar operations as those of the amplifier circuit 500 shown in FIG. 5.

In some embodiment, the amplifier circuit 500 can also be implemented by multi-stages, i.e., more than two stages of class AB amplifiers which are cascaded. In such embodiment, least one of the cascaded class AB amplifier is turned off during one signal cycle, i.e., the operation principle is the same as that of 2-stage case (i.e., the amplifier circuit 500). Although only single-end amplifier is mentioned above, it should be noted that person in the art would be easy extend it to a differential amplifier, and its operation and circuit diagram are omitted for simplicity.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier circuit, comprising:
   a first class AB amplifier, receiving an input signal, amplifying the input signal to generate the first output signal; and
   a second class AB amplifier, receiving the first output signal, amplifying the first output signal to generate the final output signal on an output node;
   wherein when the power of the input signal is greater than a threshold level, the second class AB amplifier is in a turned-off state during a turned-on duration period of the first class AB amplifier, and the first class AB amplifier is in a turned-off state during a turned-on duration period of the second class AB amplifier.

2. The amplifier circuit as claimed in claim 1, wherein when the power of the input signal is less than the threshold level, the first class AB amplifier and the second class AB amplifier are both in a turned-on state for amplifying the input signal.

3. The amplifier circuit as claimed in claim 1, wherein the first class AB amplifier comprises:
   a first PMOS amplifier (M11), coupled between a voltage source and a first node, having a gate receiving the input signal via a first capacitor; and
   a second PMOS amplifier (M21), coupled between the first node and the output node, having a gate coupled to a first bias voltage.

4. The amplifier circuit as claimed in claim 3, wherein the second class AB amplifier comprises:
   a first NMOS transistor (M32), coupled between the first node and a second node, having a gate coupled to a second bias voltage; and
   a second NMOS transistor (M42), coupled between the second node and ground, having a gate coupled to the input signal via a second capacitor.

5. The amplifier circuit as claimed in claim 4, wherein the amplifier circuit further comprises:
   a third NMOS transistor (M31), coupled between the output node and a third node, having a gate coupled to the second bias voltage; and
   a fourth NMOS transistor (M41), coupled between the third node and ground, having a gate coupled to the input signal via the second capacitor.

6. The amplifier circuit as claimed in claim 5, wherein when the power of the input signal is greater than a threshold level, the first NMOS transistor and the third NMOS transistor are turned off when the second PMOS transistor is turned on, and the first NMOS transistor and the third NMOS transistor are turned on when the second PMOS transistor is turned off.

7. The amplifier circuit as claimed in claim 1, wherein the input signal is a radio frequency signal or a baseband signal, and the amplifier circuit is a radio frequency amplifier or a baseband amplifier.

8. The amplifier circuit as claimed in claim 1, wherein the amplifier circuit is used in a SAW-less receiver system.

9. A method for improving the dynamic range of an amplifier circuit, wherein the amplifier circuit comprises a first class AB amplifier and a second class AB amplifier, the method comprising:
   amplifying an input signal by the first class AB amplifier to generate the first output signal;
   amplifying the first output signal by the second class AB amplifier to generate determining whether the power of the input signal is greater than a threshold level; and
   when the power of the input signal is greater than the threshold level, keeping the second class AB amplifier in a turned-off state during a turned-on duration period of the first class AB amplifier, and keeping the first class AB amplifier in a turned-off state during a turned-on duration period of the second class AB amplifier.

10. The method as claimed in claim 9, wherein the method further comprises:

when the power of the input signal is less than the threshold level, keeping both the first class AB amplifier and the second class AB amplifier in a turned-on state for amplifying the input signal.

11. The method as claimed in claim 9, wherein the first class AB amplifier comprises:

a first PMOS amplifier (M11), coupled between a voltage source and a first node, having a gate receiving the input signal via a first capacitor; and a second PMOS amplifier (M21), coupled between the first node and the output node, having a gate coupled to a first bias voltage.

12. The method as claimed in claim 11, wherein the second class AB amplifier comprises:

a first NMOS transistor (M32), coupled between the first node and a second node, having a gate coupled to a second bias voltage; and a second NMOS transistor (M42), coupled between the second node and ground, having a gate coupled to the input signal via a second capacitor.

13. The method as claimed in claim 12, wherein the amplifier circuit further comprises:

a third NMOS transistor (M31), coupled between the output node and a third node, having a gate coupled to the second bias voltage; and a fourth NMOS transistor (M41), coupled between the third node and ground, having a gate coupled to the input signal via the second capacitor.

14. The method as claimed in claim 13, wherein the method further comprises:

when the power of the input signal is greater than the threshold level, turning off the first NMOS transistor and the third NMOS transistor when the second PMOS transistor is turned on, and turning on the first NMOS transistor and the third NMOS transistor when the second PMOS transistor is turned off.

15. The method as claimed in claim 9, wherein the input signal is a radio frequency signal or a baseband signal, and the amplifier circuit is a radio frequency amplifier or a baseband amplifier.

16. The method as claimed in claim 9, wherein the amplifier circuit is used in a SAW-less receiver system.

* * * * *